(12) United States Patent
Guo et al.

(10) Patent No.: US 6,458,684 B1
(45) Date of Patent: *Oct. 1, 2002

(54) SINGLE STEP PROCESS FOR BLANKET-SELECTIVE CVD ALUMINUM DEPOSITION

(75) Inventors: Ted Guo, Palo Alto; Liang-Yuh Chen, San Jose; Mehul Naik, Sunnyvale; Roderick C. Mosely, Pleasanton, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/497,390

(22) Filed: Feb. 3, 2000

Related U.S. Application Data

(63) Continuation of application No. 08/620,405, filed on Mar. 22, 1996, now Pat. No. 6,077,781, which is a continuation-in-part of application No. 08/561,605, filed on Nov. 21, 1995, now Pat. No. 5,877,087.

(51) Int. Cl.[7] ............................................. H01L 21/44
(52) U.S. Cl. ...................... 438/618; 438/656; 438/668; 438/681; 438/685; 438/688
(58) Field of Search .......................... 438/618, 653, 438/656, 652, 680, 681, 688; 427/255.28, 255.34, 255.36

(56) References Cited

U.S. PATENT DOCUMENTS

| | | | |
|---|---|---|---|
| 4,770,897 A | 9/1988 | Wu | 437/228 |
| 4,784,973 A | 11/1988 | Stevens et al. | 437/200 |
| 4,832,789 A | 5/1989 | Cochran et al. | 156/644 |

(List continued on next page.)

FOREIGN PATENT DOCUMENTS

| | | |
|---|---|---|
| JP | 63-9925 | 6/1986 |
| JP | 8-10693 | 3/1989 |
| JP | 25-13900 | 1/1992 |

OTHER PUBLICATIONS

K. Mikagi, H. Ishikawa, T. Usami, M. Suzuki, K. Inoue, N. Oda, S. Chikaki, I. Sakai and T. Kikkawa, "Barrier Metal Free Copper Damascene Interconnection Technology Using Atmospheric Copper Reflow and Nitrogen Doping in SiOF Film," IEDM 96–365, pp. 14.5.1–14.5.4.

(List continued on next page.)

*Primary Examiner*—David Nelms
*Assistant Examiner*—Reneé Berry
(74) *Attorney, Agent, or Firm*—Moser, Patterson, & Sheridan LLP

(57) ABSTRACT

The present invention relates generally to an improved apparatus and process for providing uniform step coverage on a substrate and planarization of metal layers to form continuous, void-free contacts or vias in sub-half micron aperture width applications. In one aspect of the invention, a dielectric layer is formed over a conducting member. A thin nucleation layer is then deposited onto the dielectic layer prior to etching high aspect ratio apertures through the nucleation and dielectric layers to expose the underlying conducting member on the aperture floor. A CVD metal layer is then deposited onto the structure to achieve selective deposition within the apertures, while preferably also forming a blanket layer on the field. The present apparatus and process reduce the number of steps necessary to fabricate CVD metal interconnects and layers that are substantially void-free and planarized. The metallization process is preferably carried out in an integrated processing system that includes both a PVD and CVD processing chamber so that once the substrate is introduced into a vacuum environment, the metallization of the apertures to form vias and contacts occurs without the formation of oxides between the layers.

20 Claims, 5 Drawing Sheets

U.S. PATENT DOCUMENTS

| | | | |
|---|---|---|---|
| 4,920,072 A | 4/1990 | Keller et al. | 437/192 |
| 4,920,073 A | 4/1990 | Wei et al. | 437/200 |
| 4,926,237 A | 5/1990 | Sun et al. | 357/71 |
| 4,938,996 A | 7/1990 | Ziv et al. | 427/53.1 |
| 4,951,601 A | 8/1990 | Maydan et al. | 118/719 |
| 4,960,732 A | 10/1990 | Dixit et al. | 437/192 |
| 4,985,750 A | 1/1991 | Hoshino | 357/71 |
| 4,994,410 A | 2/1991 | Sun et al. | 437/192 |
| 5,010,032 A | 4/1991 | Tang et al. | 437/57 |
| 5,023,201 A | 6/1991 | Stanasolovich et al. | 437/192 |
| 5,028,565 A | 7/1991 | Chang et al. | 437/192 |
| 5,032,233 A | 7/1991 | Yu et al. | 204/192.28 |
| 5,043,299 A | 8/1991 | Chang et al. | 437/192 |
| 5,043,300 A | 8/1991 | Nulman | 437/200 |
| 5,080,933 A | 1/1992 | Grupen-Shemansky et al. | 427/255.1 |
| 5,081,064 A | 1/1992 | Inoue et al. | 437/190 |
| 5,091,339 A | 2/1992 | Carey | 437/187 |
| 5,102,826 A | 4/1992 | Ohshima et al. | 437/200 |
| 5,102,827 A | 4/1992 | Chen et al. | 437/200 |
| 5,106,781 A | 4/1992 | Penning De Vries | 437/192 |
| 5,143,867 A | 9/1992 | d'Heurle et al. | 437/188 |
| 5,147,819 A | 9/1992 | Yu et al. | 437/173 |
| 5,240,739 A | 8/1993 | Doan et al. | 427/126 |
| 5,250,465 A | 10/1993 | Iizuka et al. | 437/173 |
| 5,250,467 A | 10/1993 | Somekh et al. | 437/192 |
| 5,269,879 A | 12/1993 | Rhoades et al. | 156/643 |
| 5,292,558 A | 3/1994 | Heller et al. | 427/255 |
| 5,308,796 A | 5/1994 | Feldman et al. | 437/200 |
| 5,312,774 A | 5/1994 | Nakamura et al. | 437/192 |
| 5,316,972 A | 5/1994 | Mikoshiba et al. | 437/187 |
| 5,354,712 A | 10/1994 | Ho et al. | 437/195 |
| 5,380,682 A | 1/1995 | Edwards et al. | 437/225 |
| 5,384,284 A | 1/1995 | Doan et al. | 437/190 |
| 5,407,866 A | 4/1995 | Sellers | 437/225 |
| 5,429,991 A | 7/1995 | Iwasaki et al. | 437/192 |
| 5,439,731 A | 8/1995 | Li et al. | 428/209 |
| 5,478,780 A | 12/1995 | Koerner et al. | 437/190 |
| 5,480,836 A | 1/1996 | Harada et al. | 437/192 |
| 5,514,425 A | 5/1996 | Ito et al. | 427/534 |
| 5,578,523 A | 11/1996 | Fiodalice et al. | 437/190 |
| 5,585,308 A | 12/1996 | Sardella | 437/190 |
| 5,585,673 A | 12/1996 | Joshi et al. | 257/751 |
| 5,607,776 A | 3/1997 | Mueller et al. | 428/472 |
| 5,610,094 A | 3/1997 | Ozaki et al. | 437/62 |
| 5,610,099 A | 3/1997 | Stevens et al. | 437/192 |
| 5,629,236 A | 5/1997 | Wada et al. | 438/607 |
| 5,770,519 A | 6/1998 | Klein et al. | 438/639 |
| 5,877,087 A * | 3/1999 | Mosely et al. | 438/656 |
| 6,001,420 A * | 12/1999 | Mosely et al. | 427/258 |
| 6,077,781 A * | 6/2000 | Guo et al. | 438/688 |
| 6,080,665 A * | 6/2000 | Chen et al. | 438/653 |
| 6,120,844 A * | 9/2000 | Chen et al. | 427/255.28 |
| 6,139,905 A * | 10/2000 | Chen et al. | 427/124 |

OTHER PUBLICATIONS

Shyam P. Muraka and Steven W. Hymes, "Copper Metallization for ULSI and Beyond," Critical Reviews in Solid State and Materials Sciences, 20(2):87–124 (1995) pp. 87–93 & 119–120.

Yoshi Shacham–Diamond, Valery Dubin, Matthew Angyal, "Electroless copper deposition for ULSI," Thin Solid Films 262 (1995), pp. 93–103.

C.–K. Hu, K.L. Lee, D. Gupta, and P. Blauner, "Electromigration and Diffusion in Pure Cu and Cu(Sn) Alloys," Mat. Res. Soc. Symp. Proc. vol. 427© 1996 Materials Research Society, pp. 95–107.

K. Tsukamoto, T. Okamoto, M. Shimizu, T. Matsuykawa, and H. Harada, "Self–Aligned Titanium Silicidation by Lamp Annealing," LSI R&D Lab., Mitsubishi Electric Corp., 1984, pp. 47–50.

K. Sugai, H. Okabayaski, T. Shinzawa, S. Kishida, A. Kobayashi, T. Yako and H. Kadokura, "Aluminum chemical vapor deposition with new gas phase pretreatment using tetrakisdimethylamino–titanium for ultralarge–scale integrated–circuit metallization," Sumitomo Chemical Company Limited, Jun. 16, 1995, pp. 2115–2118.

Tohru Hara, Kouichi Tani, and Ken Inoue, Shigeaki Nakamura and Takeshi Murai, "Formation of titanium nitride layers by the nitridation of titanium in high–pressure ammonium ambient,"© 1990 American Institute of Physics, pp. 1660–1662.

Hiroshi Sinriki, et al. "Self–Aligned Rapid Thermal Nitridation of TiSi2 in NH3 Ambient as a Diffusion Barrier Layer for Selective CVD–Al Contact Plug Formation," Jpn. J. Appli. Phys., vol. 34, Pt. 1 2B, Feb. 1995, LSI Research Center, Kawasaki Steel Corp., Kawasaki–cho, Chuo–ku, Chiba City Chiba, 260, Japan, pp. 992–996.

Kazuo Tsubouchi, et al. "Area–selective CVD of Metals," Research Institute of Electrical Communication, Tohoku University, Katahira 2–1–1, Aoba–ku, Sendai 980, Japan, Films 228, May 15, 1993, pp. 312–318.

* cited by examiner

SINGLE STEP PROCESS FOR BLANKET-SELECTIVE CVD ALUMINUM DEPOSITION

This is a continuation of Ser. No. 08/620,405 filed Mar. 22, 1996, now U.S. Pat. No. 6,077,781 which is a continuation-in-part of U.S. patent application Ser. No. 08/561,605 filed on Nov. 21, 1995 is now U.S. Pat. No. 5,877,087 entitled "Low Temperate Integrated Metallization Process and Apparatus."

BACKGROUND OF THE INVENTION

1. Field of the Invention

The present invention relates to a metallization method and apparatus for manufacturing semiconductor devices. More particularly, the present invention relates to the selective metallization of apertures in insulative layers to form void-free intereconnections between conducting layers, including apertures such as contacts or vias in high aspect ratio sub-half micron applications, while preferably also forming a blanket layer on the insulative layer.

2. Background of the Related Art

Sub-half micron multilevel metallization is one of the key technologies for the next generation of very large scale integration ("VLSI"). The multilevel interconnections that lie at the heart of this technology require planarization of interconnect features formed in high aspect ratio apertures, including contacts, vias, lines or other features. Reliable formation of these interconnect features is very important to the success of VLSI and to the continued effort to increase circuit density and quality on individual substrates and die.

Two conventional methods for depositing Aluminum (Al) by chemical vapor deposition ("CVD") include a blanket process ad a selective process. CVD processes typically involve the deposition of a film layer which occurs when a component of the chemical vapor contacts a "nucleation site" on the substrate. The component attaches to the nucleation site, creating a deposit surface on which ether deposition proceeds. A blanket CVD process typically deposits a film on the entire exposed surface of the substrate including the sidewall and bottom of appertures, as well as on the field because the entire substrate surface serves as a nucleation layer. A selective process typically deposits a film only on select nucleation surfaces provided on the substrate surface.

Blanket CVD metal deposition, such as CVD Al where a metal film is deposited on the entire exposed surface of the substrate, usually requires the presence of an electrically conductive nucleation layer. Thin metal films deposited during a blat CVD process an usually conformal and provide excellent step coverage, i.e., uniform thickness of layers on the sides and base of any aperture extending into the exposed surface of the substrate, even for very small aperture geometries. Therefore, CVD of aluminum is a common method used to fill aperture however, there are two primary difficulties associated with filling high aspect ratio (height to width$\geq$2:1) apertures to form vias or contacts using blanket CVD methods. First, CVD films grow from all sides in a aperture and a void or key-hole may form in the filled aperture comprising the via or contact resulting in a compromised device. The formation of voids within these aperture is commonly referred to as crowning because the deposited layer grows upwardly and outwardly at the upper corners of the aperture and bridges at this location before the aperture has been completely filled. Second, the nucleation layer which must be deposited on the aperture walls to ensure deposition of the CVD layer thereon further reduces the width of the aperture, thereby increasing the difficulty of void-free filling of the aperture without voids.

Recent transmission electron microscopy data ("TEM") reveal that voids exist in many interconnects formed by the CVD Al process even though standard electric tests of these interconnects do not evidence the existence of this void, Referring to FIG. 3, a TEM photograph shows a cross-sectional image of a 0.45 micron via filled with CVD Al. The image clearly indicates that voids exist in the metal layer deposited within the via structure. It should be recognized that this void is very difficult to detect by regular cross sectional standard electron microscopy ("SEM") techniques, because some deformation occurs in soft aluminum during mechanical polishing of the slide preparation. In addition, electric conductivity tests many times do not detect structural abnormalities such as voids because the metal forms a bridging layer through at least a portion of the aperture. However, despite the generally positive electric conductivity test, conduction through a contact having a void therein may, over time, compromise the integrity of the integrated circuit devices in which the void is formed.

A TEM study of various CVD Al layers formed on substate indicates that the voids typically occur in a key hole pattern wherein the top portion of the via becomes sealed before the via has been entirely filled, i.e., crowning. Although a thin confound layer of CVD Al can typically be deposited in high aspect ratio apertures for creating contacts and vias at low temperatures, continued CVD deposition to completely fill the apertures typically results in the formation of voids therein. Extensive efforts have been focused on eliminating the voids in metal layers by modifying CVD processing steps and parameters.

Selective CVD Al deposition is based on the fact that the decomposition of the CVD Al precursor gas to provide a deposition film usually requires a source of electrons from a conductive nucleation film. In accordance with a conventional selective CVD Al deposition process, Al should grow in the bottom of an aperture where either a metal film or doped silicon from the underlying conductive layer has been exposed, but could not grow on the dielectric material on the field and forming the aperture walls. These underlying metal films and doped silicon, unlike the dielectric aperture walls, are both conductive and supply the electrons needed for decomposition of the Al prerursor gas and resulting deposition of Al. The result obtained through selective deposition is a "bottom.up" growth of CVD Al in the holes capable of filling very small dimension (<0.25 $\mu$m), high aspect ratio (>5:1) via or contact openings.

Referring to FIG. 2, a schematic diagram of an integrated circuit structure 10 shows a metal interconnect formed in via 14 flat was selectively nucleated by the conducting member 18 and grown uniformly upward towards the surface 20 of the dielectic layer 16. However, in actual practice of the selective deposition process, there are almost always defects on the surface of the dielectric and on the sidewalls of the apertures which provide free electrons and thus also serve as nucleation sites for CVD Al growth, causing unwanted nodule formation on the surface 20 and the walls of the apertures. Note that a nodule 12 was formed on the dielectric layer by loss of selectivity during a conventional selective CVD process to fill the via or contact 14. Various methods have been used to minimize the loss of selectivity that leads to nodule formation, especially in selective tungsten (W) technology. These methods have included, for example, preconditioning of the wafer surface and chemical mechanical polishing (CMP) of the surface to remove any nodules 12 which form on the wafer surface 20 during selective deposition. However, these methods complicate the processing steps required to form the desired circuit structure and significantly increase the expense of the integrated circuit manufacturing process. Likewise, some steps, such as CMP, cannot reach the sidewalls of the apertures. In addition, adding steps to the overall process increases the likelihood that defects may result in the formed structures.

Therefore, there remains a need for a metallizastion process for void-free filling of apertures, particularly high aspect ratio, sub-quarter micron wide apertures for forming contacts and vias. More particularly, it would be desirable to have a simple process requiring fewer processing steps to accomplish selective CVD Al deposition to create vias or contacts without nodule formation caused by the loss of selectivity on the field. It would also be desirable to have a single step process for both the selective CVD Al deposition in vias or contact and the blanket CVD Al deposition on the field.

SUMMARY OF THE INVENTION

The present invention provides a method and apparatus for forming an interconnect on a substrate having a dielectric layer covering at least a first conducting member, comprising the steps of forming a nucleation layer over the surface of the dielectric, etching an aperture through the nucleation layer and dielectric layer to form a floor exposing a portion of a conducting member and selectively depositing a metal by chemical vapor deposition on the interconnect floor and nucleation layer.

Another aspect of the invention provides a method and apparatus for preventing nodule formation on a first surface during selective chemical vapor deposition of metals on a second surface, the method comprising the steps of forming a nucleation layer on the first surface to provide substantially uniform growth of a deposited film.

Yet another aspect of the invention provides a method and apparatus for depositing metal films on select portions of a substrate, the method comprising the steps of providing at electrically conducting nucleation layer over select portions of the substrate and selectively depositing a metal film by chemical vapor deposition on the nucleation layer.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefor not to be considered limiting of its scope, for the invention may admit to other equally effective embodiments.

DETAILED DESCRIPTION OF A PREFERRED EMBODIMENT

The present invention provides a simple process and apparatus for the selective deposition of material within small geometries, such as small apertures which will form vias or contacts, that eliminates the loss of selectivity on the field. This process comprises the steps of (1) depositing a thin conducting layer, preferably titanium nitride (TiN), to serve as a nucleation layer over a field; (2) patterning and etching the nucleation and dielectric layers to form apertures having small geometries; and (3) depositing CVD metal over the structure to provide selective growth of the metal within the small geometries and, preferably, simultaneous uniform growth on the field. Accordingly, the present invention provides a method and apparatus for void-free filling of small geometries with a reduced number of processing steps and preventing the formation of nodules on the field.

Figure 3:
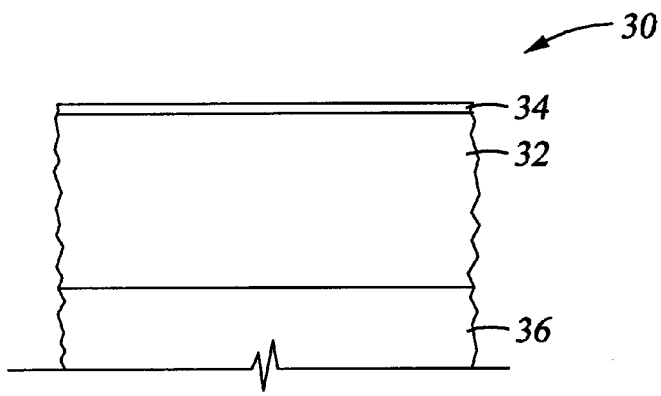
FIG. 3 is a cross-sectional view of a layered structure including a dielectric layer 32 and a nucleation layer formed sequentially over an electrically conducting member or layer.

Referring to FIG. 3, a cross-sectional diagram of a layered structure 30 is shown including a dielectric layer 32 and a nucleation layer 34 formed sequentially over an electrically conducting member or layer 36. The electrically conducting member 36 may take the form of a doped silicon substrate or it may be a first or subsequent conducting layer formed on a substrate. The electrically conducting member 36 will typically be either a metal or doped silicon layer that has been previously patterned to form part of an electronic device. A dielectric layer 32 is formed over the conducting member 36 in accordance with procedures known in the art to form a part of the overall integrated circuit.

According to presently used selective deposition techniques, the next step in the process typically includes etching the dielectric layer to form interconnecting vias or contacts. However, according to the present invention, a thin nucleation layer 34 is deposited to form a substantially continuous film over the dielectric layer 32. This nucleation layer facilitates the process by which the deposited CVD metal begins to form a solid crystalline sate of matter comprising a definite arrangement of atoms, ions or molecules on the substrate.

The preferred nucleation layer 34 includes such layers as a TiN layer formed by (PVD TiN) or conductive or other refractory film (Nb, Al, Ti, Ta, aluminum silicates, silica, high alumina, etc.), TiN formed by CVD or PVD (CVD TiN or PVD TiN), or a combination of these layers. Titanium nitride is a preferred nucleation material because titanium nitride provides good nucleation of aluminum, has good electromigration resistance and can be etched easily in applications where a dielectric layer is disposed therebelow. It is also preferred that the nucleation layer have a thickness of between about 10 and about 900 Angstroms, with the most preferred thickness being between about 100 and about 200 Angstroms.

Following formation of the nucleation layer 34, the nucleation layer 34 and dielectric layer 32, both shown in FIG. 3, are pattered and etched to open apertures for forming vias or contacts down to a conducting layer 36.

Figure 4:
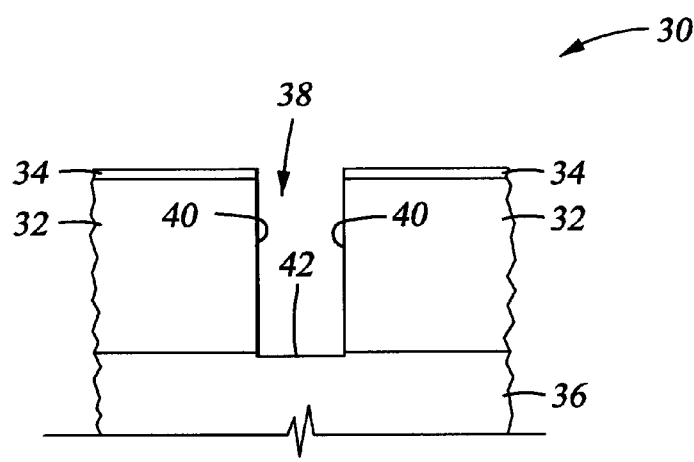
FIG. 4 is a a cross-sectional diagram of a via or contact etched into the nucleation layer and the dielectric layer in the structure of FIG. 3.

Now referring to FIG. 4, a cross-sectional diagram of a via or contact 38 etched into the nucleation layer 34 and the dielectric layer 32 of FIG. 3 is shown. The patterning and etching of the vias or contacts 38 may be accomplished with any conventional method known to one of ordinary skill in the art. The via 38 has walls 40 formed in the dielectric layer 32 that extend downward a sufficient distance to expose a surface or floor 42 of a conducing member or layer 36.

The portion of the nucleation layer 34 that remained after the etch may be described as a self-aligned layer which covers the dielectric layer 32 to form a field upon which uniform blanket deposition can occur. In this manner, the presence of the nucleation layer 34 prevents the formation of unwanted nodules 12 on the dielectric surface and eliminates the need for chemical mechanical polishing of the dielectric surface to remove any nodules formed thereon.

Figure 1:
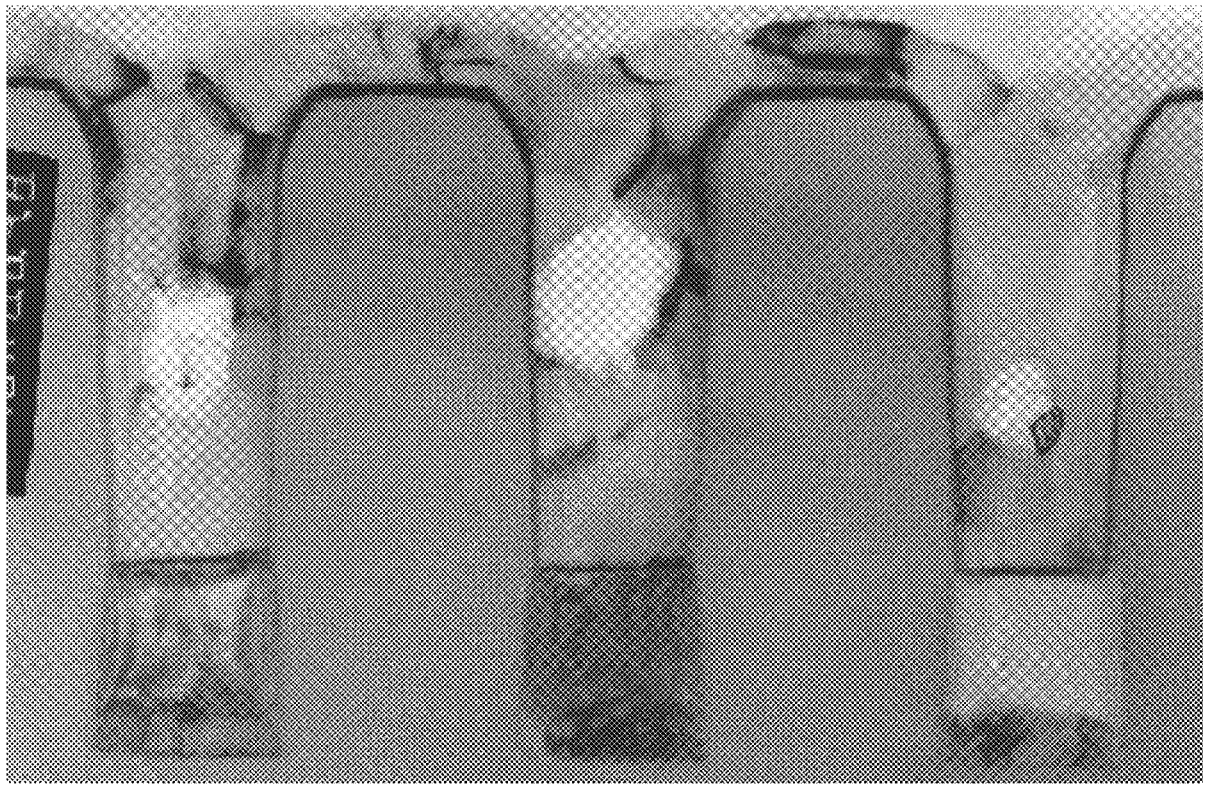
FIG. 1 is a transmission electron microscopy photograph showing a cross-section of a semiconductor substrate via having voids therein.
Figure 2:
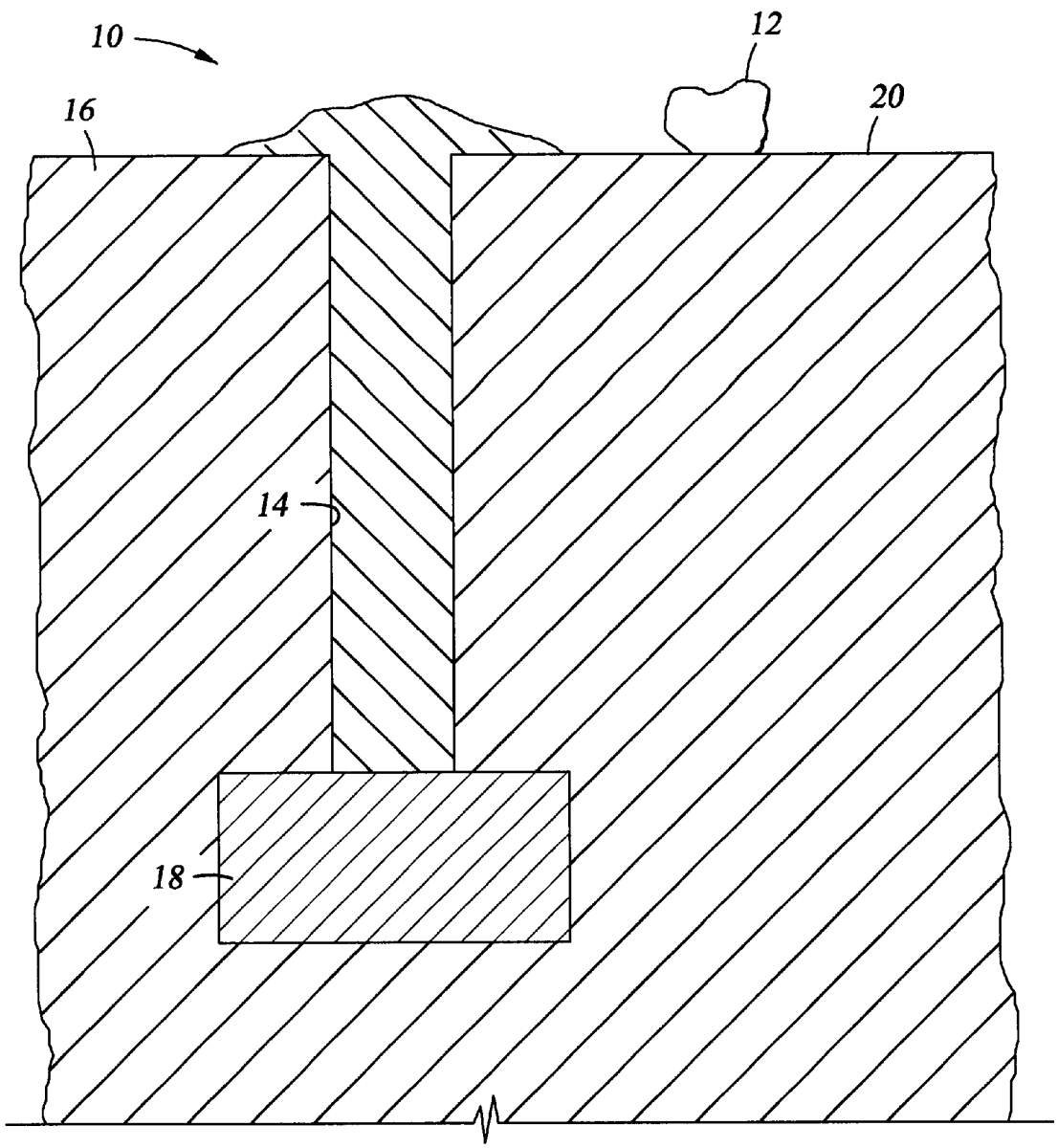
FIG. 2 is a schematic diagram showing the nodule formation caused by loss of selectivity in conventional selective chemical vapor deposition processes.
Figure 5:
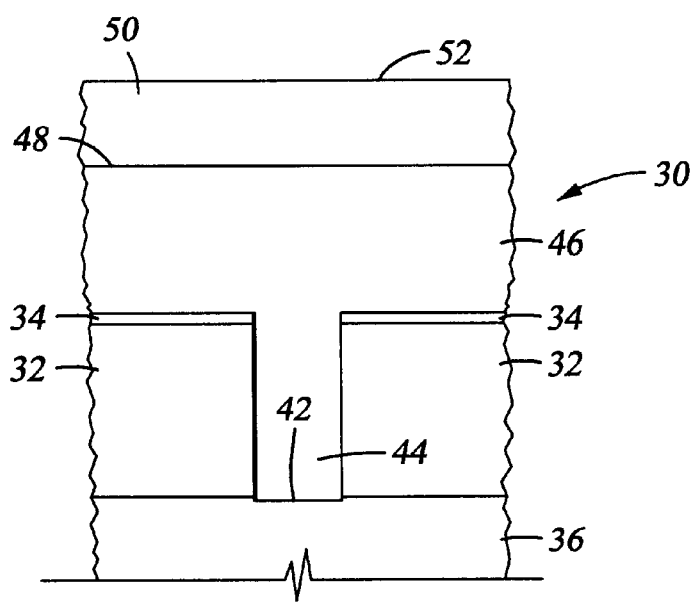
FIG. 5 is a cross-sectional view of a void-free metal interconnect and blanket metal layer as formed on the structure of FIG. 4.

Now referring to FIG. 5, a cross-sectional view of a void-free metal interconnect 44 and blanket metal layer 46 is shown. Chemical vapor deposition of a metal on the patterned substrate provides simultaneous selective deposition within the via or contact 38 and blanket deposition on the nucleation layer 34 to provide conformal coverage of the via or contact structure without forming voids (See FIG. 1) in the interconnect or nodules on the field. Due to the uniform deposition of CVD Al over the nucleation layer 34, the top surface 48 of the CVD Al is substantially planarized.

While the CVD Al may be deposited under various conditions, a typical process involves wafer temperatures of between about 150° C. and about 300° C. and a deposition rate of between about 20 Å/sec and about 130 Å/sec. The CVD Al deposition may be performed at chamber pressures of between about 1 torr and about 80 torr, with the preferred chamber pressures being about 25 torr. The preferred deposition reaction for CVD Al involves the reaction of dimethyl aluminum hydride ("DMAH") with hydrogen gas ($H_2$) according to the following equation:

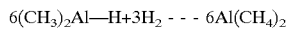

$$6(CH_3)_2Al-H+3H_2 \text{ - - - } 6Al(CH_4)_2$$

The deposition within the via or contact 38 (See FIG. 4) to form metal interconnect 44 is selective because surface 42 of the underlying conductive layer 36 has been exposed to the CVD Al at the floor of the via or contact 38. Therefore, the CVD Al is deposited from the floor 42 upward to fill the via or contact 38 without any substantial CVID Al deposition on the via or contact walls 40 (See FIG. 4).

Furthermore, see the nucleation layer 34 was deposited on the dielectric layer 32 prior to etching of the via or contact 38, the walls and floor of the via or contact 38 are the exposed surfaces of the dielectric layer 32 and the exposed underlying nucleation layer 36, restively. As discussed above, substantially non-conducting dielectric materials, including silicon, are not good electron donors and, therefore, do not provide good nucleation for decomposition of the CVD metal precursor. Rather, a metal film begins to form on the via or contact floor because the exposed conducting member 36 underlying the via or contact 38 nucleates the decomposition. After an initial layer of the metal has been deposited on the via or contact floor 42, subsequent deposition occurs more easily so that the metal grows from the via or contact floor 42 outward to fill the hole 38.

Although defied on the dielectric wall 40 of the via or contact 38 may cause the formation of scattered nodules within the via or contact, these nodules will usually not block the via or contact and cause voids therein. Because the conducting via or contact floor exposes a large surface area of a nucleation material, the via or contact will be filled with metal from the floor upward before a nodule has an opportunity to grow across the via or contact and form a void therein In another aspect of the present invention, the substrate may be moved to a PVD Al chamber following the selective CVD process to deposit a PVD Al layer 50 over the CVD layer previously formed at temperatures below the melting point of the CVD Al and PVD Al. Where the CVD metal layer 46 is aluminum, it is preferred that the PVD Al layer 50 be deposited at a wafer temperature below about 660° C., preferably below about 400° C. The aluminum layer 46 will start to flow during the PVD deposition process at about 400° C., with the TiN nucleation layer 34 remaining firmly in place as a solid metal layer, It is preferred that the PVD Al layer include at least trace amounts of copper (Cu). This can be accomplished by using an AlCu target to form PVD AlCu layer. When the PVD AlCu sequentially follows CYD Al in an integrated process having a PVD and CVD chamber on the same cluster tool, an oxide layer cannot form therebetween and the PVD AlCu layer 50 grows epitaxially on the CVD Al layer 46 without grain boundaries, i.e., uniform crystal structure throughout both layers. Furthermore, the sequential CVD Al/PVD AlCu process allows the intermixed layer (elements 46 and 50 combined) to be annealed at about 300° C. for about 15 minutes to achieve substantially uniform distribution of Cu in the CVD/PVD layers. It is also preferred that the top surface 52 of the intermixed CVD/PVD Al layer receive a PVD TiN anti-reflection coating ("ARC") (not shown) for reducing the reflectivity of the surface and improving the photolithographic performance of the layer. Finally, a most preferred method of the present invention for metallization of a substrate aperture includes the sequential steps of covering a conducting member 36 with a dielectric layer 32, depositing a nucleation layer 34 of titanium nitride through a PVD TiN process, etching vias or contacts 38 to expose a portion of the conducting member 36, depositing selective/blanket CVD Al layer 44,46, depositing a PVD AlCu layer 50 and depositng a TiN ARC (not shown).

Figure 6:
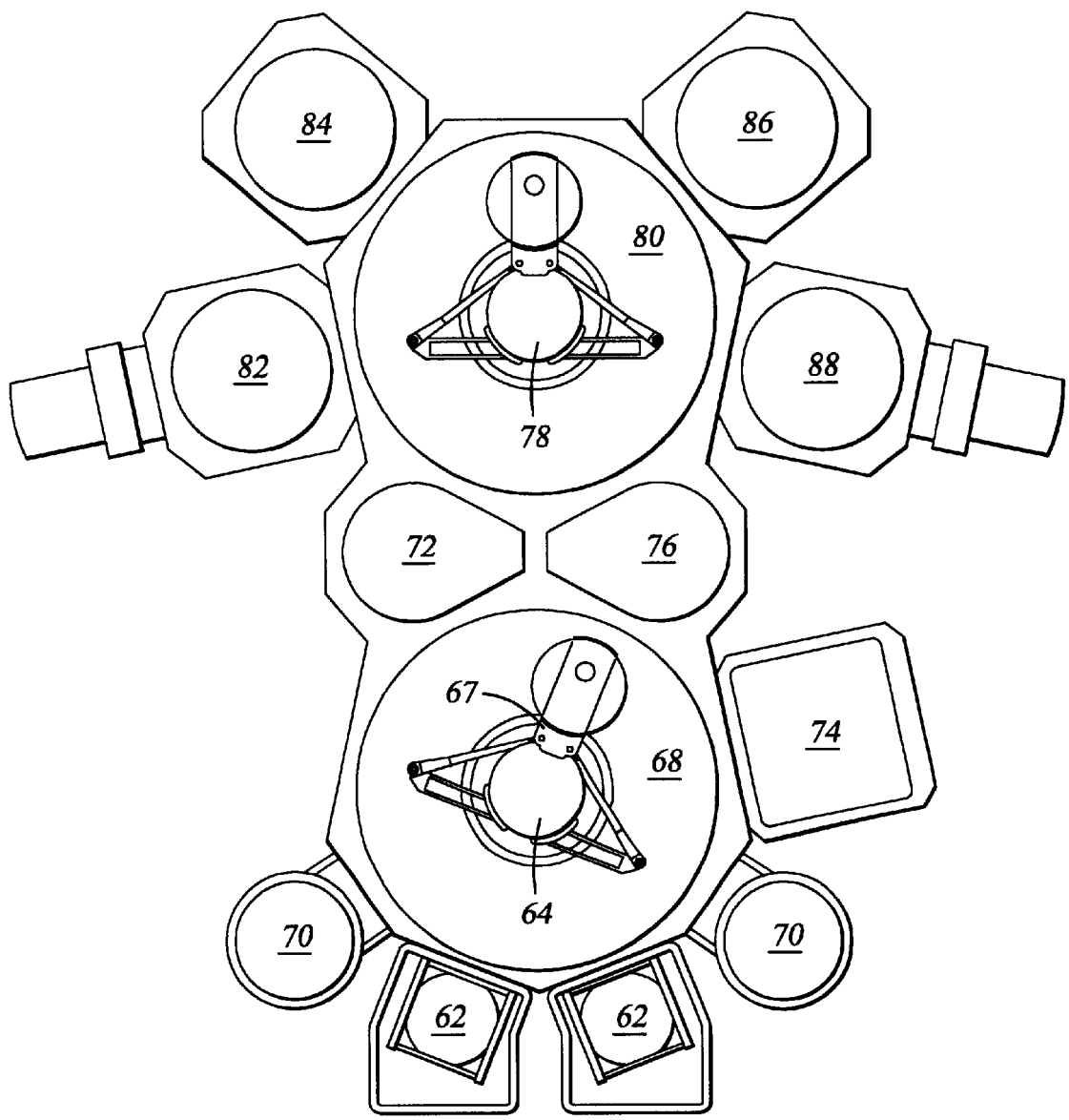
FIG. 6 is an integrated processing system configured for sequential metallization in accordance with the present invention.

Referring now to FIG. 6, a schematic diagram of an integrated cluster tool 60 is shown. Typically, substrates are introduced and withdrawn from the cluster tool 60 through a cassette loadlock 62. A robot 64 having a blade 67 is located within the cluster tool 60 to move the substrates through the cluster tool 60. One robot 64 is typically positioned in a buffer chamber 68 to transfer substrates between the cassette loadlock 62, degas wafer orientation chamber 70, preclean chamber 72, PVD TiN chamber 74 and cooldown chamber 76. A second robot 78 is located in transfer chamber 80 to transfer substrates to and from the cooldown chamber 76, coherent Ti chamber 82, CVD TiN chamber 84, CVD Al chamber 86 and PVD AlCu processing chamber 88. The transfer chamber 80 in the integrated system is preferably maintained at low/high pressure vacuum in the range of $10^{-3}$ to $10^{-8}$ torr. This specific configuration of the chambers in FIG. 6 comprise an integrated processing system capable of both CVD and PVD processes in a single cluster tool. The chamber configuration is merely illustrative and should not be taken as limiting the application of the present invention.

Typically, a substrate processed in the cluster tool 60 is passed from the cassette loadlock 62 to the buffer chamber 68 where the robot 64 first moves the substrate into a degas chamber 70. The substrate may then be transferred into preclean chamber 72, PVD TiN chamber 74, and then into a cooldown chamber 76. From the cooldown chamber 76, the robot 78 typically moves the substrate into and between one or more processing chambers 32,31, before returning the substrate back to the cooldown chamber 76. It is anticipated that the substrate may be processed or cooled in one or more chambers any number of times in any order to accomplish fabrication of a desired structure on the substrate. The substrate is removed from the cluster tool 60, following processing, through the buffer chamber 68 and then to the loadlock 62. A microprocessor controller 80 is provided to control the sequence and formation of the desired film layers on the substrates.

In accordance with the present invention, the cluster tool 60 passes a substrate through loadlock 62 into de-gas chamber 70 wherein the substrates are introduced to outgas contaminants. A substrate is then moved into a pre-clean chamber 72 where the surface of the substrate is cleaned to remove any contaminants thereon. The substrate is then moved by the robot 64 into cooldown chamber 76 in preparation of processing. The robot 78 transfers the substrate to either a CVD TiN chamber 84, or a Ti chamber 82 having a collimator, i.e., a plurality of cells extending substantially parallel to the substrate, located between the substrate and the target, to deposit a nucleation layer on the substrate. In the case where the substrate first receives deposition of a collimated Ti layer, the substrate is then typically processed in the CVD TiN chamber 84. Following deposition of the CVD TiN layer, the substrate is moved into an etch chamber for patterning and plasma etching of the layers formed thereon to form the desired apertures which will form the vias or contacts.

The substrate, with apertures extending through the TiN nucleation layer and dielectric layer down to the exposed conducting member surface defining the floor of the via or contact, then receives a layer of CVD metal, such as CVD Al, in a CVD Al chamber 86. The substrate may then be processed in a PVD AlCu chamber 98 and, optionally, in a PVD TiN chamber 74 located on the integrated system.

Cu dispersion throughout the CVD Al layer is accomplished because the integrated system allows the substrate to be processed continually in a single processing tool having both a CVD Al chamber and a PVD Al chamber. This prevents exposure of the processed substrate to the outside environment which may result in the formation of oxide layers on the exposed surface, i.e., the CVD Al layer. Oxide layers allowed to form on the CVD Al layers will inhibit even distribution of the Cu provided by the PVD Al layer throughout the CVD Al layer.

One staged-vacuum wafer processing system is disclosed in U.S. Pat. No. 5,186,718, entitled "Staged-Vacuum Wafer Processing System and Method," Tepman et al., issued on Feb. 16, 1993, which is hereby incorporated herein by reference.

Figure 7:
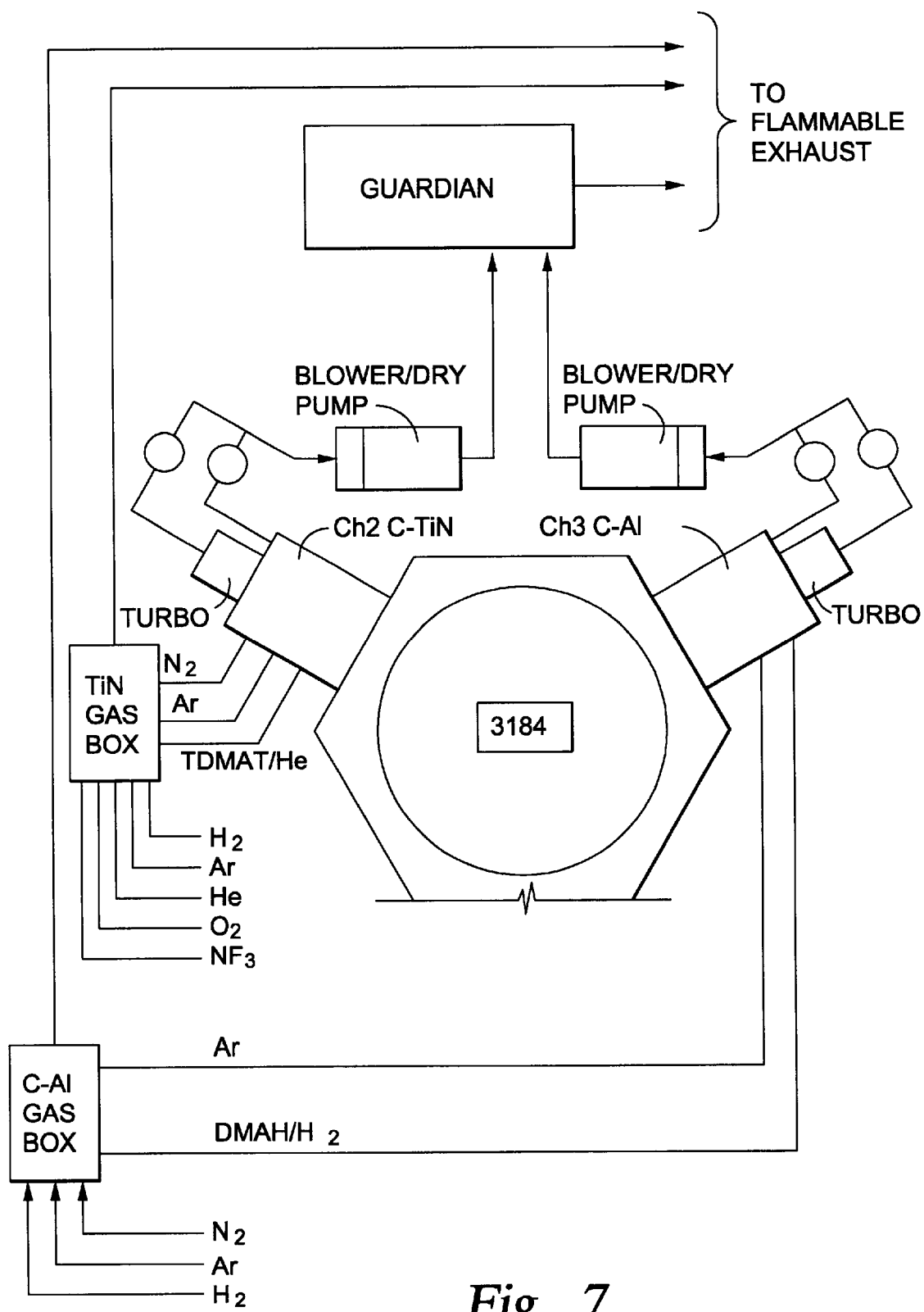
FIG. 7 is a schematic flow diagram of a CVD gas box delivery system for supplying gases to the system of FIG. 6.

Referring now to FIG. 7, a gas box system for supplying gases to the CVD chamber of the system in FIG. 6 is illustrated. The TiN gas box is supplied with $N_2$, Ar, He, $O_2$, $H_2$, and $NF_3$. The reaction product tetracus dimethyl amino titanium ("TDMAT"), along with the inert gas Ar and $N_2$, are passed into the CVD TiN chamber for processing. Similarly, a CVD Al gas box is supplied with $N_2$, Ar and H. The reaction product dimethyl aluminum hydride ("DMAH"), $H_2$ and the inert gas Ar are passed into the CVD Al chamber for deposition of aluminum. Both chambers are equipped with a turbo pump for providing a vacuum in the chamber and a blower/dry pump.

While the foregoing is directed to the preferred embodiment of the present invention, other and further embodiments of the invention may be devised without departing from the basic scope thereof. The scope of the invention is determined by te claims which follow.

We claim:

1. A method of forming an interconnect on a substrate having a dielectric layer covering a conducting member, comprising:

a) forming a nucleation layer over the surface of the dielectric layer, wherein the nucleation layer is a material selected from the group consisting of Ti, TiN, Ta, Nb, aluminum, silica, aluminum silicates, and combinations thereof;
   b) etching an interconnect through the nucleation layer and dielectric layer to form an interconnect floor exposing a portion of the conducting member; and
   c) chemical vapor depositing a metal layer selectively on the interconnect floor and nucleation layer.

2. The method of claim 1 further comprising:

d) physical vapor depositing a metal layer over the chemical vapor deposited metal layer at a temperature below about 660° C. to cause the physical vapor deposited metal layer and chemical vapor deposited metal layer to flow into the interconnect without voids forming therein.

3. The method of claim 1 wherein the nucleation layer has a thickness of less than about 900 Angstroms.

4. The method of claim 3, wherein the nucleation layer has a thickness of between about 10 Angstroms and about 200 Angstroms.

5. The method of claim 1, wherein the chemical vapor deposited metal is aluminum.

6. The method of claim 2, wherein the physical vapor deposited metal comprises aluminum, and wherein the physical vapor deposition of aluminum occurs at a temperature below about 400° C.

7. The method of claim 1, wherein the method is performed in an integrated processing system.

8. The method of claim 6, wherein the physical vapor deposited aluminum comprises a dopant.

9. The method of claim 2, further comprising:

(e) annealing the substrate at a temperature of between about 250° C. and about 350° C.

10. In a selective chemical vapor deposition process for forming and filling interconnects through a nonconducting layer, wherein the interconnects have a conducting floor, the improvement comprising:

a) forming a nucleation layer over the nonconducting layer, wherein the nucleation layer is a material selected from the group consisting of Ti, TiN, Ta, Nb, aluminum, silica, aluminum silicates, and combinations thereof; and
    b) etching interconnects through the nucleation layer and nonconducting layer.

11. The process of claim 10, wherein the nonconducting layer is a dielectric layer.

12. The process of claim 10, wherein the nucleation layer has a thickness of less than about 900 Angstroms.

13. The process of claim 12, wherein the nucleation layer has a thickness of between about 10 Angstroms and about 200 Angstroms.

14. A method of preventing nonuniform deposits on a first surface during selective chemical vapor deposition of metals on a second surface, the method comprising forming a nucleation layer from a material selected from the group consisting of Ti, TiN, Ta, Nb, aluminum, silica, aluminum silicates, and combinations thereof, on the first surface so that metal chemical vapor deposited on the first surface will be substantially planarized.

15. The method of claim 14, wherein the first surface comprises a dielectric material.

16. The method of claim 14, wherein the nucleation layer has a thickness of less than about 900 Angstroms.

17. The method of claim 16, wherein the nucleation layer has a thickness of between about 10 Angstroms and about 200 Angstroms.

18. A method of depositing metal films on select portions of a substrate, the method comprising:
(a) providing an electrically conducting nucleation layer selected from a material from the group consisting of Ti, TiN, Ta, Nb, aluminum, silica, aluminum silicates, and combinations thereof, over select portions of the substrate; and
(b) selectively chemical vapor depositing a metal film on the nucleation layer.

19. The method of claim 18, wherein the selectively chemical vapor depositing the metal film comprises:
(c) providing a metal precursor and an inert gas;
(d) reacting the metal precursor and an inert gas at the nucleation layer surface at a temperature of between about 150° C. and about 300° C. to deposit the metal layer on the nucleation layer.

20. The method of claim 19, wherein the nucleation layer has a thickness of less than about 900 Angstroms and the metal layer comprises aluminum.

* * * * *

UNITED STATES PATENT AND TRADEMARK OFFICE
CERTIFICATE OF CORRECTION

PATENT NO. : 6,458,684 B1
DATED : October 1, 2002
INVENTOR(S) : Ted Guo et al.

It is certified that error appears in the above-identified patent and that said Letters Patent is hereby corrected as shown below:

Column 1,
Line 7, please change "Temperate" to -- Temperature --.
Line 17, please change "intereconnections" to -- interconnections --.
Line 37, please change "ether" to -- further --.
Line 40, please change "apertures" to -- apertures --.
Line 48, please change "blat" to -- blanket -- and "an" to -- are --.

Column 2,
Line 24, please change "confound" to -- conformal --.
Line 38, please change "could" to -- should --.
Line 42, please change "prerursor" to -- precursor --.
Line 49, please change "flat" to -- that --.

Column 4,
Line 46, please change "sate" to -- state --.
Line 64, please change "pattered" to -- patterned --.

Column 5,
Line 27, please change "Åsec" to -- Å/sec --.
Line 41, please change "CVID" to -- CVD --.
Line 43, please change "sec" to -- since --.
Line 47, please change "restively" to -- respectively --.

Column 6,
Line 15, please change "CYD" to -- CVD --.

UNITED STATES PATENT AND TRADEMARK OFFICE
CERTIFICATE OF CORRECTION

PATENT NO. : 6,458,684 B1
DATED : October 1, 2002
INVENTOR(S) : Ted Guo et al.

It is certified that error appears in the above-identified patent and that said Letters Patent is hereby corrected as shown below:

Column 7,
Line 30, please change "chamber 98" to -- chamber 88 --.
Line 63, please change "te" to -- the --.

Signed and Sealed this

Twenty-fifth Day of March, 2003

JAMES E. ROGAN
*Director of the United States Patent and Trademark Office*